US006391524B2

(12) United States Patent
Yates et al.

(10) Patent No.: US 6,391,524 B2
(45) Date of Patent: May 21, 2002

(54) ARTICLE HAVING IMAGABLE COATINGS

(75) Inventors: Michael Yates, West Yorkshire (GB); Celin Savariar-Hauck; Gerhard Hauck, both of Badenhausen (DE); Hans-Joachim Timpe, Baumhofstrabe 165 (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/444,126

(22) Filed: Nov. 19, 1999

(51) Int. Cl.$^{7}$ ............................ G03F 7/105; G03F 7/30

(52) U.S. Cl. ................................ 430/286.1; 430/270.1; 430/300; 430/322; 430/330; 430/944; 101/457; 101/467

(58) Field of Search ........................... 430/270.1, 281.1, 430/286.1, 905, 926, 944, 945, 942, 300, 322, 320, 330, 331; 101/457, 467

(56) References Cited

U.S. PATENT DOCUMENTS

| | | | | | |
|---|---|---|---|---|---|
| 3,628,953 | A | | 12/1971 | Brinckman ................. | 96/36.3 |
| 3,802,885 | A | | 4/1974 | Lawson et al. ................ | 96/75 |
| 4,680,195 | A | | 7/1987 | Pfeifer ........................ | 427/44 |
| 4,783,372 | A | | 11/1988 | Pfeifer ....................... | 428/435 |
| 4,859,758 | A | * | 8/1989 | Shalati et al. ............... | 527/313 |
| 4,947,348 | A | * | 8/1990 | Van Arsdell ................ | 364/523 |
| 5,672,458 | A | * | 9/1997 | Tutt et al. .................... | 430/124 |
| 5,700,619 | A | | 12/1997 | Baumann et al. ........... | 430/175 |
| 6,060,217 | A | * | 5/2000 | Nguyen et al. ............. | 430/302 |
| 6,174,652 | B1 | * | 1/2001 | Chapman et al. ........... | 430/338 |
| 6,296,982 | B1 | * | 10/2001 | Yates et al. ................. | 430/192 |

FOREIGN PATENT DOCUMENTS

| | | |
|---|---|---|
| EP | 0162017 | 11/1985 |
| WO | 9739894 | 10/1997 |
| WO | 9901795 | 1/1999 |
| WO | 9901796 | 1/1999 |
| WO | 9908879 | 2/1999 |
| WO | 9911458 | 3/1999 |
| WO | 9921715 | 5/1999 |
| WO | 9921725 | 5/1999 |

OTHER PUBLICATIONS

"D19C Densitomer: Ready to Meet Your Needs Today, Equipped For Tomorrow's Requirements", GretagzMacbeth Brochure; http//www.gretagmacbeth.com.*

English Abstract for EP 0 162 017.

F. Rodriguez, "Principles of Polymer Science" (3rd ed. 1989), pp. 367–370, discussed at p. 15, lines 14–16 of the specification.

* cited by examiner

*Primary Examiner*—Janet Baxter
*Assistant Examiner*—Yvette M. Clarke
(74) *Attorney, Agent, or Firm*—Baker Botts L.L.P.

(57) ABSTRACT

A heat-sensitive composition, for example a coating on a lithographic printing plate, comprises a carboxylic acid derivative of a cellulosic polymer. The composition may contain a radiation absorbing compound and suitable electromagnetic radiation, preferably infra-red radiation, may be used to heat the composition imagewise. The presence of the cellulosic polymer enhances resistance to certain organic liquids.

21 Claims, 2 Drawing Sheets

PLATE 1 (COMPARATIVE DATA)

PLATE 2

50% EXPOSURE

FULL EXPOSURE

50% EXPOSURE

FULL EXPOSURE

ARTICLE HAVING IMAGABLE COATINGS

FIELD OF THE INVENTION

This invention relates to methods of imaging articles having imagable coatings, for example to make lithographic printing plates or electronic parts, such as printed circuits.

BACKGROUND OF THE INVENTION

A generally used type of lithographic printing plate precursor (by which we mean a coated printing plate prior to exposure and development) has a radiation sensitive coating applied to an aluminum substrate. A positive working precursor has a radiation sensitive coating, which after imagewise exposure to radiation of a suitable wavelength becomes more soluble in the exposed areas than in the non-exposed areas, in a developer. Only the remaining, image, area of the coating is ink-receptive.

The differentiation between image and non-image areas is made in the exposure process where a film is applied to the printing plate precursor with a vacuum to ensure good contact. The printing plate precursor is then exposed to a radiation source; conventionally this has been a UV radiation source. In the case where a positive printing plate precursor is used, the area of the film that corresponds to the image in the printing plate precursor is opaque so that no light will strike the printing plate precursor, whereas the area on the film that corresponds to the non-image area is clear and permits the transmission of light to the coating which becomes more soluble and is removed on development.

In the manufacture of electronic parts such as printed circuits, after exposure to radiation and development, the resist pattern is used as a mask for forming the patterns onto the underlying electronic elements - for example by etching an underlying copper foil. Due to the high resolution demands and the requirements of high resistance to etching techniques, positive-working systems are widely used. In particular, in the main there have been used alkali developable positive working resists mainly composed of alkali-soluble novolac resins.

The types of electronic parts whose manufacture may use a resist include printed wiring boards (PWBs), thick- and thin-film circuits, comprising passive elements such as resistors, capacitors and inductors; multichip devices (MDCs); and integrated circuits (ICs). These are all classified as printed circuits.

Imagable compositions may also be applied to plastics films in order to form masks. The required pattern is formed on the mask, which is then used as a screen in a later processing step, in forming a pattern on, for example, a printing plate or electronic part precursor.

Common to virtually all commercial applications of positive working systems employing UV radiation over several decades have been compositions comprising alkali soluble phenolic resins and naphthoquinone diazide (NQD) derivatives. The NQD derivatives have been simple NQD compounds used in admixture with resins, or NQD resin esters in which the photoactive NQD moiety has been chemically attached to the resin itself, for example by esterification of the resin with an NQD sulphonyl chloride.

U.S. Pat. No. 3,802,885 describes a UV sensitive positive working printing plate containing a naphthoquinone-(1,2)-diazide-(2)-5-sulphonic acid derivative, the printing life of which is said to be improved by the inclusion of a polymeric carboxylic acid. Polymeric carboxylic acids listed are cellulose acetate hydrogen phthalate, collophony-containing resin, carboxyl group containing styrene-maleic acid copolymer, oil-free alkyd resin, fatty acid-free phthalate resin and poly(vinyl hydrogen phthalate). Example 1 of U.S. Pat. No. 3,802,885 describes a number of compositions each containing a polymeric carboxylic acid, a novolac resin and 2,3,4-trihydroxy benzophenone tris-[naphthoquinone-(1,2)-diazide-(2)-5-sulphonate]. Each such composition was tested as a printing plate coating and found to have an estimated life ("run length") of more than 200,000 copies. A comparison composition without a polymeric carboxylic acid failed after 20 revolutions due to poor adhesion of the image to the plate surface.

The run length of many printing plates can be significantly increased by subjecting them to a heat treatment step ("baking step") after their development. However subjecting developed plates to a baking step is not always desirable or practicable.

As demands on the performance of UV sensitive positive working coatings have increased so NQD technology has become limiting. In addition, digital and laser imaging technology is making new demands on coatings.

We have devised new positive working heat sensitive systems, to meet the new demands. Our new systems and methods are the subject of our patent applications WO 97/39894, WO 99/01796, WO 99/01795, WO 99/08879, WO 99/21715, WO 99/21725 and WO 99/11458.

Heat is delivered to the coatings described by conduction, using a heated body such as a stylus, or by charged particle radiation, or, preferably, by means of infra-red radiation, the coatings then containing suitable infra-red absorbers.

Our new systems are very effective and even without a post-development baking step give good run lengths on printing presses but it would be desirable to improve their resistance to organic liquids. Positive working printing plate coatings often have poor resistance to chemicals used in a press room environment. For example the solvents used to clean certain inks from printing plates after initial printing may degrade the remaining coating, and make re-working and further use impossible. Certain inks and fount solutions may contain organic liquids which attack the coatings. These deficiencies are particularly marked with those coatings containing novolac resins.

It is an object of embodiments of the invention to provide heat sensitive coatings with improved resistance to organic liquids, notably those used in printing processes and in printed circuit board manufacture.

SUMMARY OF THE INVENTION

We have devised a method which offers improvement of our new systems mentioned above, such that their coatings continue to show good developability, with heated areas dissolving in aqueous developers and with unheated areas remaining insoluble in such developers, but wherein the coatings have improved resistance to certain organic liquids.

We did not find that polymeric carboxylic acids in general were effective in achieving this improvement. However, to our surprise we found that one particular class of polymeric carboxylic acids were effective.

In accordance with a first aspect of the invention there is provided a film-forming composition comprising a carboxylic acid derivative of a cellulosic polymer, and a compound which absorbs incident radiation in the wavelength range 600–1400 nm and converts it to heat, the composition having the property that when provided as a solid coating on a substrate regions which have been heated imagewise selectively dissolve in an aqueous developer leaving behind regions which have not been heated.

Suitably said remaining unheated regions have good resistance to organic liquids. Preferably the remaining unheated regions are more resistant to organic liquids than the remaining unheated regions of a corresponding coating treated in the same way but not containing the carboxylic acid derivative of a cellulosic polymer.

The composition may be a liquid composition, containing a solvent, or a solid composition, for example a coating on a substrate, the solid composition being formed by the evaporation of the solvent from the liquid composition.

In this specification weight percentages of components are expressed with reference to a solid composition.

The presence of the carboxylic acid derivative of a cellulosic polymer appears to confer upon the compositions improved resistance to certain organic liquids, for example petroleum ethers, alkanediols, for example hexanediol, other glycols, glycol ethers, straight-chain alkanols, for example ethanol, branched alkanols, for example isopropanol and 1-methoxypropan-2-ol, cycloalkanols, for example cyclohexanol, and beta-ketoalkanols, for example diacetone alcohols (ie 4hydroxy4-methyl-2-pentanone). When we refer herein to a composition or coating as being resistant to organic liquids we are referring to a composition or coating which is preferably resistant to organic liquids of at least one of these classes (ie petroleum ethers; glycols and glycol ethers; and alkanols) more preferably to organic liquids of at least two of them; and most preferably to organic liquids of all three of them.

The composition may comprise a resin blend having as one resin component a carboxylic acid derivative of a cellulosic polymer.

DETAILED DESCRIPTION OF THE INVENTION

Figure 1:
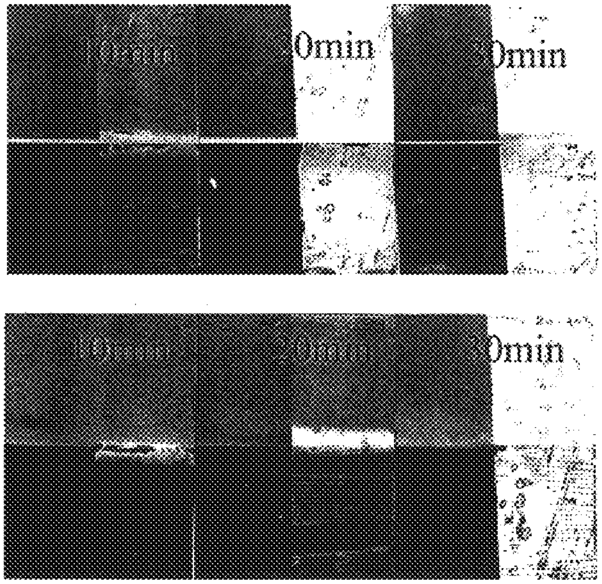
FIG. 1 illustrates the photograph of the checkerboard pattern imaged on the precursors and then processed, using fount solution 1 (see example 4).

Suitably the carboxylic acid derivative of a cellulosic polymer provides at least 0.25%, preferably at least 0.5%, more preferably at least 1%, yet more preferably at least 2%, most preferably at least 5%, and, especially, at least 8%, of the weight of the composition.

Suitably the carboxylic acid derivative of a cellulosic polymer provides up to 50%, preferably up to 30%, more preferably up to 20%, still more preferably up to 16%, and most preferably up to 12%, of the weight of the composition.

Preferably the acid number of the carboxylic acid derivative of the cellulosic polymer is at least 50, more preferably at least 80, most preferably at least 100.

Preferably the acid number of the carboxylic acid derivative of the cellulosic polymer does not exceed 210, and preferably does not exceed 180.

"Acid number" is the number of milligrams of potassium hydroxide needed to neutralize 1 gram of the acidic compound.

Said carboxylic acid derivative of a cellulosic polymer may be a carboxylic acid derivative of a cellulose alkanoate, especially of a cellulose acetate.

Said carboxylic acid derivative of a cellulosic polymer may be a reaction product of a cellulosic polymer and of a carboxylic acid or, especially, of an acid anhydride thereof. The carboxylic acids and acid anhydrides may be defined by the formulae

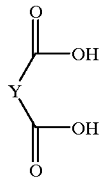

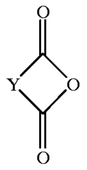

Y is suitably of the formula $$—CR^1R^2)_n—$$

or $$—CR^5{=}CR^6—$$

where n represents an integer from 1 to 6, $R^1$ independently represents a hydrogen atom or an alkyl group (and when n is greater than 1 the groups $R^1$ need not be identical with each other), $R^2$ represents a hydrogen atom or an alkyl group (and when is greater than 1 the groups $R^2$ need not be identical with each other), $R^5$ represents a hydrogen atom or an alkyl group, $R^6$ represents a hydrogen atom or an alkyl group, or $R^5$ and $R^6$ together represent a chain such that the group $—CR^5{=}CR^6—$is an optionally substituted aryl or heteroaryl group.

Any alkyl group is suitably a $C_{1-6}$ alkyl group, preferably a $C_{1-4}$ alkyl group, and, most preferably, a methyl group.

An optionally substituted aryl group may be an optionally substituted naphthyl or, preferably, an optionally substituted phenyl group (such that the relevant anhydride is phthalic anhydride).

An optionally substituted heteroaryl group may suitably comprise 5 or 6 ring atoms of which 1 or more, preferably 1 or 2, are hetero atoms selected from oxygen, sulphur or nitrogen. Preferred heteroaryl groups have 1 oxygen atom; or 1 sulphur atom; or 1 or 2 nitrogen atoms.

Optional substituents of an aryl or heteroaryl group may suitably be selected from halogen atoms, and from $C_{1-4}$ alkyl, $C_{1-4}$ haloalkyl, cyano, $C_{1-4}$ alkoxy and carboxylic acid groups. There may suitably be 1–3 substituents but preferred aryl or heteroaryl groups are unsubstituted.

Most preferably Y is selected from the following groups:

$$—CR^1R^2—CR^3R^4$$

$$—CR^5{=}CR^6—$$

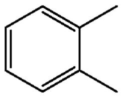

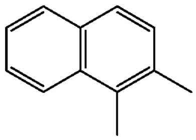

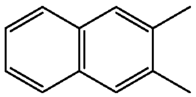

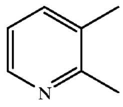

-continued

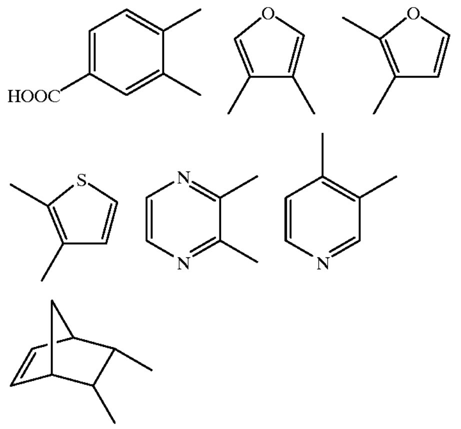

wherein each of $R^1$, $R^2$, $R^3$, $R^4$, $R^5$ and $R^6$ independently represents a hydrogen atom or an alkyl group.

Particularly preferred carboxylic acid derivatives of a cellulosic polymer are the materials commercially available under the names CAP (cellulose acetate phthalate), CAHP (cellulose acetate hydrogen phthalate—CAS No 9004-38-0) and CAT (cellulose acetate trimellitate— CAS No 52907-01-4). Cellulose acetate propionate (CAS No 9004-39-1) and cellulose acetate butyrate (CAS No 9004-36-8) are also commercially available and may be useful.

In the present invention there is a requirement that the cellulosic polymer has carboxylic acid functionality but it may have further functional groups, for example hydroxyl groups or alkoxy groups, or groups containing an amide functionality.

Preferably the composition contains, as a further resin component, a polymer having hydroxyl groups. Preferably the further resin component, or the further resin components in total, is/are present in a greater amount by weight than said carboxylic acid derivative of a cellulosic polymer, or of said carboxylic acid derivatives of cellulosic polymers in total. Preferably the composition contains at least 40%, more preferably at least 50%, still more preferably at least 70%, and most preferably at least 80% of such a further resin component, or of such further resin components in total, by weight based on the total weight of the composition.

Particularly useful phenolic resins in this invention are condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis(4-hydroxyphenyl)propane), and appropriate aldehydes, for example formaldehyde, chloral, acetaldehyde and furfuraldehyde and/or ketones, for example acetone. Dependent on the preparation route for the condensation a range of phenolic materials with varying structures and properties can be formed. Particularly useful in this invention are novolac resins, resole resins and novolac/resole resin mixtures. Most preferred are novolac resins. The type of catalyst and the molar ratio of the reactants used in the preparation of phenolic resins determines their molecular structure and therefore the physical properties of the resin. An aldehyde: phenol ratio between 0.5:1 and 1:1, preferably 0.5:1 to 0.8:1 and an acid catalyst is used to prepare novolac resins.

Examples of suitable novolac resins have the following general structure

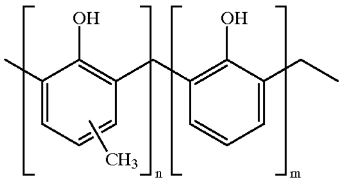

Other polymers suitable for inclusion in the composition, notably in admixture with a phenolic, preferably novolac, resin and the carboxylic acid derivative of a cellulosic polymer, include: a polymer or copolymer of styrene, a polymer or copolymer of hydroxystyrene, notably of 4-hydroxystyrene or 3-methyl-4-hydroxystyrene, a polymer or copolymer of an alkoxystyrene, notably of 4-methoxystyrene, a polymer or copolymer of acrylic acid, a polymer or copolymer of methacrylic acid, a polymer or copolymer of acrylonitrile, a polymer or copolymer of acrylamide, a polymer or copolymer of vinyl alcohol, an acrylate polymer or copolymer, a polymer or copolymer of methacrylamide, a sulphonamido or imido polymer or copolymer, a polymer or copolymer of maleiimide or of alkylmaleiimide or of dialkylmaleiimide, a polymer or copolymer of maleic anhydride (including partially hydrolysed forms), a hydroxycellulose or a carboxycellulose.

A large number of compounds, or combinations thereof, can be utilized as radiation absorbing compounds in preferred embodiments of the present invention.

The radiation absorbing compound may usefully be a pigment, which is a black body or broad band absorber. It may be carbon such as carbon black or graphite. It may be a commercially available pigment such as Heliogen Green as supplied by BASF or Nigrosine Base NG1 as supplied by NH Laboratories Inc or Milori Blue (C.I. Pigment Blue 27) as supplied by Aldrich.

The radiation absorbing compound may usefully be an infra-red absorbing dye able to absorb the radiation selected for imaging and convert it to heat.

Preferably the infra-red absorbing compound is one whose absorption spectrum is significant at the wavelength output of the laser which is (in preferred embodiments) to be used in the method of the present invention. Usefully it may be an organic pigment or dye such as phthalocyanine pigment. Or it may be a dye or pigment of the squarylium, merocyanine, cyanine, indolizine, pyrylium or metal dithioline classes.

Suitably the radiation absorbing compound, when present, constitutes at least 0.25%, preferably at least 0.5%, more preferably at least 1%, most preferably at least 2%, of the total weight of the coating. Suitably the radiation absorbing compound, when present, constitutes up to 25%, preferably up to 20%, and most preferably up to 15%, of the total weight of the coating. There may be more than one radiation absorbing compound. References herein to the proportion of such compound(s) are to their total content.

The composition may comprise one or more insolubilizer(s) to confer on the composition the property that when provided as a coating on the substrate unheated regions of the coating have reduced solubility in an aqueous developer, compared with a corresponding composition without the insolubilizer(s).

Said insolubilizer(s) may be covalently bonded to a polymer of the composition or may be a compound which is not covalently bonded thereto.

Said insolubilizer(s) may be selected from:

functional groups as described in WO 99/01795.

separate reversible insolubilizer compounds, being diazide moieties (in particular quinone diazide moieties) as described in WO 99/01796.

separate reversible insolubilizer compounds, not being diazide moieties, and being as described in WO 97/39894, WO 99/08879, WO 99/11458, WO 99/21715 and WO 99/21725. Examples described include nitrogen-containing compounds wherein at least one nitrogen atom is either quaternized or incorporated in a heterocyclic ring; or quaternized and incorporated in a heterocyclic ring. Examples of useful quarternized nitrogen containing compounds are cationic triaryl methane dyes such as Victoria Blue (CI Basic Blue 7), Crystal Violet (Gentian Violet, CI Basic Violet 3) and Ethyl Violet (CI Basic Violet 4). WO 97/39894 describes lithographic printing applications and WO 99/08879 describes electronic part applications of this technology. WO 99/21715 describes improvements to this technology brought about by use of a heat treatment carried out as part of the manufacture of articles bearing the composition.

WO 99/21725 describes improvements to this technology brought about by the use of certain developer resistance aids, notably siloxane compounds.

Certain useful compositions of the present invention have the property that when provided as a coating on a substrate the solubility of the coating in an aqueous developer is not substantially increased by ambient ultraviolet radiation.

Certain preferred compositions of the present invention do not contain diazide moieties, especially quinonediazide moieties.

With certain compositions to which the present invention is applied heat imaging is believed to produce areas of the coating which have transient increased solubility in the developer. After an interval such areas may partially or wholly revert to their original, non-imaged level of solubility. Thus the mode of action of such preferred coatings does not require heat-induced lysis of the modifying means but, more likely, the break-up of a physico-chemical complex, which can re-form. Consequently, in such embodiments the precursor is contacted with a developer within a time period of 20 hours or less of the exposure to imaging heat, preferably within about 120 minutes of exposure, and most preferably within 5 minutes of exposure.

An especially preferred composition of the present invention thus has an infra-red absorbing compound to convert infra-red radiation to heat and a said separate reversible insolubilizer compound as described in WO 97/39894 or WO 99/08879; or an infra-red absorbing compound which converts infra-red radiation to heat and which also functions as a reversible insolubilizer compound; for example a cyanine dye having both such characteristics.

Suitably a reversible insolubilizer compound, when present (whether or not also acting as a radiation absorbing compound) constitutes at least 0.25%, preferably at least 0.5%, more preferably at least 1%, and most preferably at least 2%; and preferably up to 15%, more preferably up to 25%, of the total weight of the composition. There may be more than one reversible insolubilizer compound. References herein to the proportion of such compound(s) are to their total content.

Suitably the composition contains a developer resistance means as defined in WO 99/21725, suitably a siloxane, preferably constituting 0.1–10 wt% of the composition. Preferred siloxanes are substituted by one or more optionally-substituted alkyl or phenyl groups, and most preferably are phenylalkylsiloxanes and dialkylsiloxanes. Preferred siloxanes have between 10 and 100—$Si(R^1)(R^2)O$—repeat units. The siloxanes may be copolymerised with ethylene oxide and/or propylene oxide. For further information on preferred siloxanes the definitions in WO 99/21725 may be recited.

The compositions of the invention may contain other ingredients such as stabilising additives, inert colorants, and additional inert polymeric binders as are present in many positive working coatings.

In accordance with a second aspect of the invention there is provided a positive working lithographic printing plate precursor or electronic part precursor having a coating on a substrate, the coating comprising a composition as defined above.

The coating may be laid down from a liquid form of the composition, from which a solvent is removed by evaporation, to form the dried coating.

After the provision of the coating on the substrate, the resultant precursor may be subjected, as part of its manufacture, to a stabilizing heat treatment step. We favor carrying out the heat treatment at a temperature of at least 40° C., preferably at least 45° C., most preferably at least 50° C. As regards the upper limit, we favor using a temperature not in excess of 90° C., preferably not in excess of 85° C., most preferably not in excess of 60° C. In general, heat treatments in which the maximum temperature does not exceed the glass transition temperature (Tg) of the composition (as measured by differential scanning calorimetry (DSC) at a heating rate of 10° C./minute) are favored. Such heat treatments are suitably carried out on a stack of precursors or on a precursor coil, and so are efficient.

We favor carrying out such a heat treatment for at least 4 hours; and preferably for at least 24 hours and most preferably for at least 48 hours.

Preferably such a heat treatment takes place under conditions which inhibit the removal of water from the precursor, for example by wrapping the precursor (or preferably a stack or coil thereof) in a water impermeable material and/or by using humidity control. For further information on such heat treatments WO 99/21715 can be referred to.

The coating may contain polymeric particles in order to improve its mechanical properties. Suitably the polymeric particles constitute at least 0.25%, preferably at least 0.5%, more preferably at least 1%, yet more preferably at least 2%, most preferably at least 5%, and, especially, at least 7%, by weight of the coating.

Suitably the polymeric particles constitute up to 50%, preferably up to 40%, more preferably up to 30%, yet more preferably up to 25%, most preferably up to 20%, and, especially, up to 14%, by weight of the coating.

In this specification weight percentages are expressed with reference to the solid coating without the organic solvent.

Preferably the mean diameter of the polymeric particles is in the range 0.5–15 micrometers, preferably 1–10 micrometers, especially 3–7 micrometers, as determined visually by an operator using scanning electron microscopy and a scale. Preferably the mean diameter of the polymeric particles, as thus measured, is larger than the mean thickness of the coating. s Whilst we are not bound by any theory as to how the invention works we believe that the presence of the particles may have a stress relieving effect and/or facilitate crack termination; and/or that they protrude from the surface and are the parts contacted by objects, and thus may protect the rest of the coating from contact with objects.

An important factor is also believed to be the surface tension at the interfaces between the particles and the matrix material.

Preferred particles for use in the present invention are those which are evenly dispersed in the coating, and which have relatively low critical surface tension ($\gamma_c$). Critical surface tension ($\gamma_c$) is discussed in Principles of Polymer Science, $3^{rd}$ edition, Ferdinand Rodriguez, ISBN 0891161767 at pages 367–370. Figures given herein are measured by the standard test described therein at 20° C.

Preferably the particles are of a material which has a $\gamma_c$ value of less than 50 milli-$Nm^{-1}$, preferably less than 40, more preferably less than 35, and, especially, less than 25. Most preferred of all is a $\gamma_c$ value of less than 20.

Preferably the polymeric particles are selected from optionally substituted polyolefin, polyamide and polyacrylic particles. More preferably they are selected from polyolefins and halogenated, especially fluorinated, polyolefins. Polyethylene and polytetrafluoroethylene particles ($\gamma_c$ values typically about 31 milli-$Nm^{-1}$ and about 18.5 respectively) are especially preferred.

In accordance with a third aspect of the invention there is provided a method of manufacturing a precursor of the invention as defined herein. The method may include a stabilizing heat treatment step as defined herein.

A substrate may comprise a metal layer. Preferred metals include aluminum, zinc, copper and titanium.

A substrate in embodiments of the invention intended as printing plate precursors may be arranged to be non-ink-accepting. Said substrate may have a hydrophilic surface for use in conventional lithographic printing using a fount solution or it may have an ink-repelling surface suitable for use in waterless printing.

For printing applications the substrate may be aluminum which has undergone the usual graining, anodic and post-anodic treatments well known in the lithographic art for enabling a radiation sensitive composition to be coated thereon and for its surface to function as a printing background. Another substrate which may be used in the present invention in the context of lithography is a plastics material base or a treated paper base as used in the photographic industry. A particularly useful plastics material base is polyethylene terephthalate which has been subbed to render its surface hydrophilic. Also a so-called coated paper which has been corona discharge treated can be used.

Preferred printing plates have a substrate which has a hydrophilic surface and an oleophilic ink-accepting coating.

For electronic part applications the substrate may comprise a copper sheet, for example a copper/plastics laminate. After imaging and development an etching agent may be used to remove exposed metal regions, leaving, for example, a printed circuit.

For certain mask applications the substrate may be a plastics film.

Thus in preferred embodiments a positive working pattern may be obtained after patternwise exposure and development of a precursor made by the method of the present invention. The developer solubility of the coating after it has been subjected to heat during patternwise exposure is greater than the solubility of the corresponding unexposed coating. In preferred embodiments this solubility differential is increased by means of additional components and/or by resin modification, as described herein, and in our earlier patent applications which are referred to. Preferably such measures reduce the solubility of the polymeric composition, prior to the patternwise exposure. On subsequent patternwise exposure the exposed areas of the coating are rendered more soluble in the developer, than the unexposed areas. Therefore on patternwise exposure there is a change in the solubility differential of the unexposed coating and of the exposed coating. Thus in the exposed areas the coating is dissolved, to form the pattern.

The coated precursor produced by the method of the invention may in use be patternwise heated indirectly by exposure to a short duration of high intensity radiation transmitted or reflected from the background areas of a graphic original located in contact with the recording material.

The developer is dependent on the nature of the coating, but is preferably an aqueous developer. Common components of aqueous developers are surfactants, chelating agents such as salts of ethylenediamine tetraacetic acid, organic solvents such as benzyl alcohol and phenoxy ethanol, phosphates, and alkaline components such as inorganic metasilicates, hydroxides and bicarbonates, and mixtures of the foregoing.

Suitably the film-forming composition of the invention is inherently soluble in an alkaline developer. Suitably it may be rendered insoluble in an alkaline developer by means of one or more insolubilizer(s). Preferably, in use, provided as a coating, it is more soluble in an alkaline developer that it is in neutral liquids such as water. Certain useful coatings are substantially insoluble in neutral liquids, such as water.

Preferably an aqueous developer is an alkaline developer containing one or more inorganic or organic metasilicates.

In the specification when we state that a coating is developer soluble we mean that it is soluble in a selected developer, to an extent useful in a practical development process. When we state that a coating is developer insoluble we mean that it is not soluble in the selected developer, to an extent useful in a practical development process.

In accordance with a fourth aspect of the invention there is provided a method for preparing a printing plate, mask or electronic part from a positive working precursor of the invention as defined herein , the method comprising the steps of (i) heating the coating imagewise; and (ii) removing the heated regions of the coating using a developer liquid.

The heating of selected areas is preferably effected by the use of infra-red electromagnetic radiation, the coating preferably containing a radiation absorbing compound as defined above, or a radiation absorbing compound being provided as a separate layer. Alternatively charged particle radiation could be used to deliver heat. Alternatively heat could be delivered directly, by a heated body applied to the coating or to the reverse face of the substrate. In this case no radiation absorbing compound is needed.

In preferred methods the electromagnetic radiation employed for exposure is of wavelength at least 650 nm, preferably at least 700 nm, and more preferably at least 750 nm. Most preferably it is at least 800 nm. Suitably the radiation is of wavelength not more than 1350 nm, preferably not more than 1300 nm, more preferably not more than 1200 nm, and most preferably not more than 1150 nm.

The radiation may be delivered by a laser under digital control. Examples of lasers which can be used to expose coatings suitable for the method of the present invention include semiconductor diode lasers emitting at between 6OOnm and 1400 nm, especially between 700 nm and 120 m. One example is the Nd YAG laser which emits at 1064 nm and another is the diode laser used in the Creo Trendsetter thermal image setter, which emits at 830 nm, but any laser of sufficient imaging power and whose radiation is absorbed by the coating to produce heat, can be used.

In accordance with a fifth aspect of the invention there is provided an article bearing a pattern in a coating thereon, produced by the method of the fourth aspect. The article may be a mask or an electronic part but is preferably a printing plate, ready for printing. If wished such a printing plate may undergo a baking step after its chemical development for still further increased run length but this is not needed for most printing applications.

In accordance with a sixth aspect of the invention there is provided a heat imagable printing plate precursor or electronic part precursor or mask precursor having a coating on a substrate, the coating comprising a carboxylic acid derivative of a cellulosic polymer, and a compound which absorbs incident radiation in the wavelength range 600–1400 nm and converts it to heat, the composition having the property that when provided as a coating on a substrate, imagewise heated and subjected to an aqueous developer, regions which have been heated dissolve in the aqueous developer leaving behind regions which have not been heated; wherein the coating has improved chemical resistance in comparison with a corresponding coating not containing the carboxylic acid derivative of the cellulosic polymer (that is, in which the weight proportion which would have been constituted by the carboxylic acid derivative of the cellulosic polymer is instead constituted by other polymeric material of the coating).

In accordance with a seventh aspect of the present invention there is provided a method of improving the chemical resistance of a heat imagable coating provided on a printing plate precursor or electronic part precursor or mask precursor, the method comprising the incorporation, during the manufacture of the precursor, of a carboxylic acid derivative of a cellulosic polymer into the composition which is to provide the coating, wherein the resultant coating has improved chemical resistance in comparison with a corresponding coating not containing the carboxylic acid derivative of the cellulosic polymer (that is, in which the weight proportion which would have been constituted by the carboxylic acid derivative of the cellulosic polymer is instead constituted by other polymeric material of the coating).

It will be apparent that the present invention is connected to previous inventions we have made and the content of the following patent applications is hereby incorporated by reference in their entirety:

WO 97/39894, WO 99/01795, WO 99/01796, WO 99/21715, WO 99/21725, WO 99/08879 and WO 99/11458.

The following examples more particularly serve to illustrate the present invention described hereinabove, but are not meant to limit the invention in any way.

EXAMPLE 1

A coating formulation was made by dissolving 0.75 g PD-140A (novolac resin, Borden Co., USA), 0.15 g PMP 92 (copolymer of methacrylamide, N-phenyl maleintide and APK, which is methacryloxyethylisocyanate reacted with aminophenol, DIC, Japan), 0.10 g CAP (cellulose acetate/phthalate, acid number 140, Eastman Chemical Co., USA), 0.03 g Ethyl Violet (basic violet 4, from Aldrich, Dorset, UK) and 0.04 g ADS 830A (an IR dye, from ADS Corp., Canada) in 13 g of a solvent mixture comprising 1-methoxypropan-2-ol: 1,3-dioxolane:methanol, 15:45:40 volume ratio. The solution was coated using a wire wound bar onto an electrolytically grained, anodized and polyvinylphosphonic acid sealed aluminum substrate and dried in an oven for 4 minutes at 90° C. to obtain a printing plate precursor having a coating weight of 1.9 $g/m^2$.

Ethyl violet has the structure:

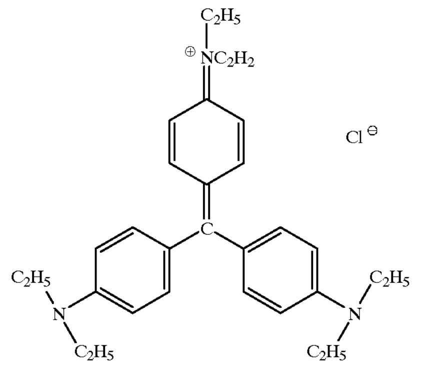

ADS 830A has the structure:

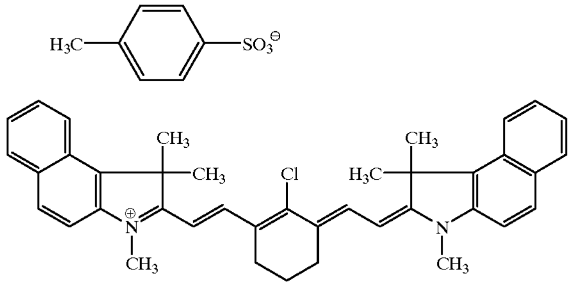

The precursor was imaged, soon after drying, with a 870 nm laser diode with 0.7 W power, mounted on a rotating drum to obtain single lines and solid exposed areas. On developing, soon after imaging, with a potassium waterglass developer, Developer 2000M (Kodak Polychrome Graphics), a good positive image was obtained. The plate showed good developability after 15 seconds and the imaged areas showed resistance to Developer 2000M for more than 120 seconds.

To assess the solvent resistance of the exposed and developed plate the following empirical procedure was used: 10×10 cm pieces of the plate were immersed in a blanket wash solvent mixture consisting of petroleum ether: isopropanol (85:15 volume ratio). In this experiment (and in the other experiments recorded herein) time steps of 1 minute of immersion were employed (1 minute, 2 minutes, 3 minutes, 4 minutes, 5 minutes and 6 minutes) and at each stage the plates were wiped gently with a POLYTAM wipe, and then removed from the solution to see whether coating was lost. This was assessed by change of plate colour. The resistance to the blanket wash mixture was more than 4 minutes. The same performance was found on immersion in pure di-acetone alcohol as solvent.

A gravimetric procedure for determining the weight of coating lost was made by placing a 10 cm×10 cm piece of the plate in 50 ml of the same petroleum ether: isopropanol mixture. The weight of the original coating on the plate was known. After 4 minutes of immersion time the piece was removed from the mixture, dried in the oven for 4 minutes at 90° C. and then re-weighed. In this way the weight loss of coating was determined to be 2wt% on total coating weight.

EXAMPLE 2

A coating formulation was made by dissolving 0.75 g PD-140A, 0.15 g PMP 92, 0.10 g AC 35-2 (cellulose acetate/phthalate derivative containing amide groups, acid number 61, prepared by the method of Example 3 described in DE 195 18 110 using 40 g CAP resin reacted with 3.68 g phenyl oxazoline and 2.48 g ethyl oxazoline), 0.03 g Ethyl Violet and 0.04 g ADS 830A in 13 g of a solvent mixture (1-methoxypropan-2-ol: 1,3-dioxolane:methanol, 15:45:40 volume ratio). The solution was coated using a wire wound bar onto an electrolytically grained, anodized and polyvinylphosphonic acid sealed substrate and dried in an oven for 4 minutes at 90° C. to obtain a printing plate precursor with a coating weight of 2.0 g/$m^2$.

The precursor was imaged, soon after drying, with a 870 nm laser diode with 0.7 W power, mounted on a rotating drum to obtain single lines and solid exposed areas. The plate was developed, soon after imaging, to give a positive image after 20 seconds dwell time in Developer 2000M.

The resistance to the blanket wash mixture of petroleum ether: isopropanol (85:15 volume ratio) determined by the empirical procedure as described in Example 1 was more than 4 minutes.

EXAMPLE 3

A coating formulation was made by dissolving 3.1 g PD-140A, 0.4 g CAP, 0.16 g EC 2117 (IR dye, FEW Wolfen, Germany), 0.08 g ADS 1060A (an IR dye, from ADS Corp., Canada), 0.08 g N-benzyl quinolinium bromide, 0.10 g OB 613 (a triarylmethane dye, Orient Chemical Industry, Co., Japan) in 30 ml of solvent mixture (n-butanol:methanol:methyl ethyl ketone, 20:45:35 volume ratio). The solution was coated using a wire wound bar onto an electrolytically grained, anodized and polyvinylphosphonic acid sealed substrate and dried in an oven for 4 minutes at 90° C. to obtain a printing plate precursor with a coating weight of 2.1 g/$m^2$.

The structure of ADS 1060A is:

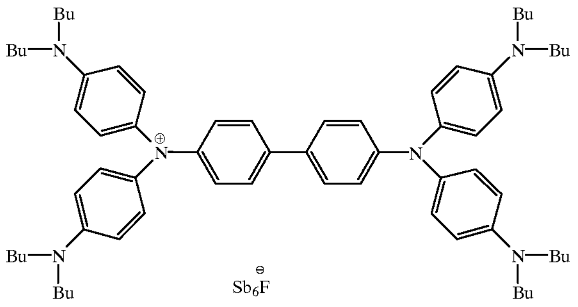

The precursor was imaged, soon after drying, with an 870 nm laser diode with 0.7 W power, mounted on a rotating drum to obtain single lines and solid exposed areas. The developer was made by dissolving 10.59 g sodium metasilicate, 2.2 g sodium triphosphate 12-hydrate, 0.15 g sodium monophosphate, 0.18 g TRILON B (the tetrasodium salt of ethylenediamine tetraaeetic acid, from BASF AG, Germany) and 0.0045 g PLURIOL P600 (polypropylene glycol, from BASF AG) in 87 g distilled water. The plate was developed, soon after imaging, with this mixture and gave a positive image after 20 seconds dwell time.

The resistance to the blanket wash mixture of petroleum ether: isopropanol (85:15 volume ratio) determined by the empirical procedure as described in Example 1 was more than 4 minutes.

Comparative Example 1

A coating solution was made by dissolving 0.85 g PD-140A, 0.15 g PMP 92, 0.03 g Ethyl Violet and 0.04 g ADS 830A in 13 g of a solvent mixture (1-methoxypropan-2-ol: 1,3-dioxolane:methanol, 15:45:40 volume ratio). The solution was coated using a wire wound bar onto an electrolytically grained, anodized and polyvinylphosphonic acid sealed aluminum substrate and dried in an oven for 4 minutes at 90° C. to obtain a printing plate precursor with a coating weight of 1.9 g/$m^2$.

The precursor was imaged, soon after drying, with an 870 nm laser diode with 0.7 W power, mounted on a rotating drum to obtain single lines and solid exposed areas. The plate was developed, soon after imaging, using a potassium waterglass developer, Developer 3000 (Kodak Polychrome Graphics) to give a positive image.

The resistance to the blanket wash mixture (petroleum ether:isopropanol, 85:15 volume ratio), determined by the empirical procedure given in Example 1, was less than 1 minute.

Comparative Example 2

A coating solution was made by dissolving 0.75 g PD-140A, 0.30 g ZH 8050 (novolac resin, DIC, Japan), 0.15 g PMP 92, 0.03 g Ethyl Violet and 0.04 g ADS 830A in 13 g of a solvent mixture (1-methoxypropan-2-ol: 1,3-dioxolane:methanol 15:45:40 volume ratio). The solution was coated on an electrolytically grained, anodized and polyvinylphosphonic acid sealed aluminum substrate and dried in an oven for four minutes at 90° C., to obtain a printing plate precursor with a coating weight of 1.9 g/$m^2$.

The precursor was imaged, soon after drying, with an 870 nm laser diode with 0.7 W power, mounted on a rotating drum to obtain single lines and solid exposed areas. The plate was developed, soon after imaging, in Developer 2000M to give a positive image.

The resistance to the blanket wash mixture (petroleum ether : isopropanol, 85:15 volume ratio) determined as described in Example 1 was less than 1 minute.

Comparative Example 3

A coating formulation was made by dissolving 3.5 g PD140A, 0.16 g EC 2117, 0.08 g ADS 1060A, 0.08 g N-benzyl quinolium bromide, 0.10 g OB 613 in 30 ml of solvent mixture (n-butanol:methanol:methyl ethyl ketone, 20:45:35 volume ratio). The solution was coated on an electrolytically grained, anodized and polyvinylphosphonic acid sealed aluminum substrate and dried in an oven for four minutes at 90° C., to obtain a printing plate precursor with a coating weight of 2.1 g/$m^2$.

The precursor was imaged, soon after drying, with an 870 nm laser diode with 0.7 W power, mounted on a rotating drum to obtain single lines and solid exposed areas. For development of this plate the developer described in Example 3 was used, and development was carried out soon after imaging.

The resistance to the blanket wash mixture (petroleum ether : isopropanol, 85:15 volume ratio) determined as described in Example 1 was less than 1 minute.

Example 4 and

Comparative Example 4

Coating formulations were made by dissolving the following materials in 1-methoxypropan-2-ol in the proportions given in Table 1 below:

LB6564—a 1:1 phenol/cresol novolac resin, from Bakelite, UK, having the structure:

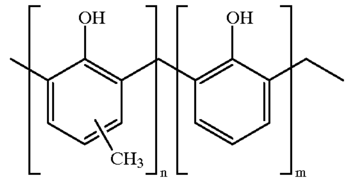

n = m

LB744—a cresol novolac resin, from Bakelite, UK, having the structure:

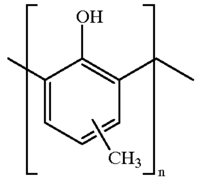

KF654B PINA—an IR dye from Allied Signal, Middlesex, UK, believed to have the structure:

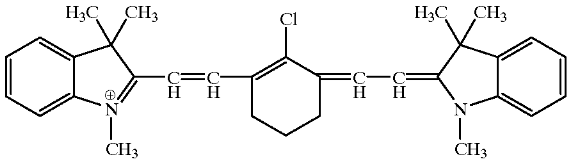

DP 113 Crystal Violet—basic violet 3, C.I. 42555, Gentian Violet, From Aldrich, Dorset, UK, having the structure:

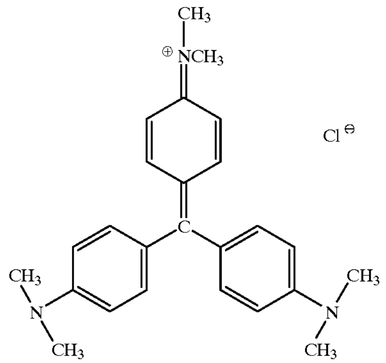

P50X—Silikophen P50X, a phenyl methyl siloxane, from Tego Chemie, Germany.

CAHP—Cellulose Acetate Hydrogen Phthalate, from Aldrich.

TABLE 1

| Material | Plate 1 (Weight %) | Plate 2 (Weight %) |
|---|---|---|
| LB6564 | 70 | 53.5 |
| LB744 | 20 | 35 |
| P50X | 6 | 6 |
| KF654 | 2 | 0.5 |
| DP113 | 2 | 2 |

TABLE 1-continued

| Material | Plate 1 (Weight %) | Plate 2 (Weight %) |
|---|---|---|
| ADS 830A | 0 | 1 |
| CAHP | 0 | 2 |
| Film weight g/m$^2$ | 2.0 | 2.2 |

The solutions were coated with a wire wound bar on hydrochloric acid grained, anodized and phosphated aluminum substrates of 0.3 mm thickness, and dried at 110° C. for 90 seconds in a Mathis labdryer oven as supplied by Werner Mathis AG, Germany. The precursors were stacked, with polythene coated paper (polythene coated paper No 22, 6 gm$^{-2}$, as supplied by Samuel Grant, Leeds, UK) inserted as interleaving between each precursor and an extra 10 blanks put on top and underneath the stack before wrapping the whole stack in polythene-coated paper (unbleached, unglazed Kraft paper 90 gm$^{-2}$ coated with matt black low density polythene 20 gm$^{-2}$, as supplied by Samuel Grant) and sealing with adhesive tape (SELLOTAPE). The wrapped stack was heat treated at 55° C. for 72 hours in a Sanyo Gallenkamp environmental chamber, Model No HCC 019. PFI.F, as supplied by Sanyo Gallenkamp of Leicester, UK.

The precursors were imaged on a Creo Trendsetter 3244 imagesetter, emitting at 830 nm, with an imaging energy density of 200 mJ/cm$^2$ and developed, soon after imaging, in a Kodak Polychrome Graphics Mercury Mk 5 processor containing 14 wt% sodium metasilicate pentahydrate developer at 22.5° C. at a speed of 750mm/min. 2 to 95% dots were measured with a Gretag D19C Densitometer, available from, Colour-Data Systems Ltd, Wirral, UK.

A strip of 50% checkerboard pattern was also imaged on the precursors which were then processed as described above. Samples of the plates were cut into 6×10 cm$^2$ pieces so that half the area lengthways was covered by a 50% tint and the other half was covered by a solid region. The samples were immersed in fount solution 1 or 2 (see below) for 10, 20 and 30 minutes, carefully washed and dried.

| Fount solution 1: | | Fount solution 2: | |
|---|---|---|---|
| Isopropyl alcohol | 165 g | Isopropyl alcohol | 165 g |
| SUBSTIFIX | 44 g | COMBIFIX | 44 g |
| Water | 800 g | Water | 800 g |

COMBIFIX and SUBSTIFIX are standard fount solution additives available from Horstmann-Steinberg of Germany. Each comprises surfactants and printers add them, and similar products, to fount solutions in order to keep the substrate ink free, to soften the water and to aid ink dispersion over the plate surface.

Figure 2:
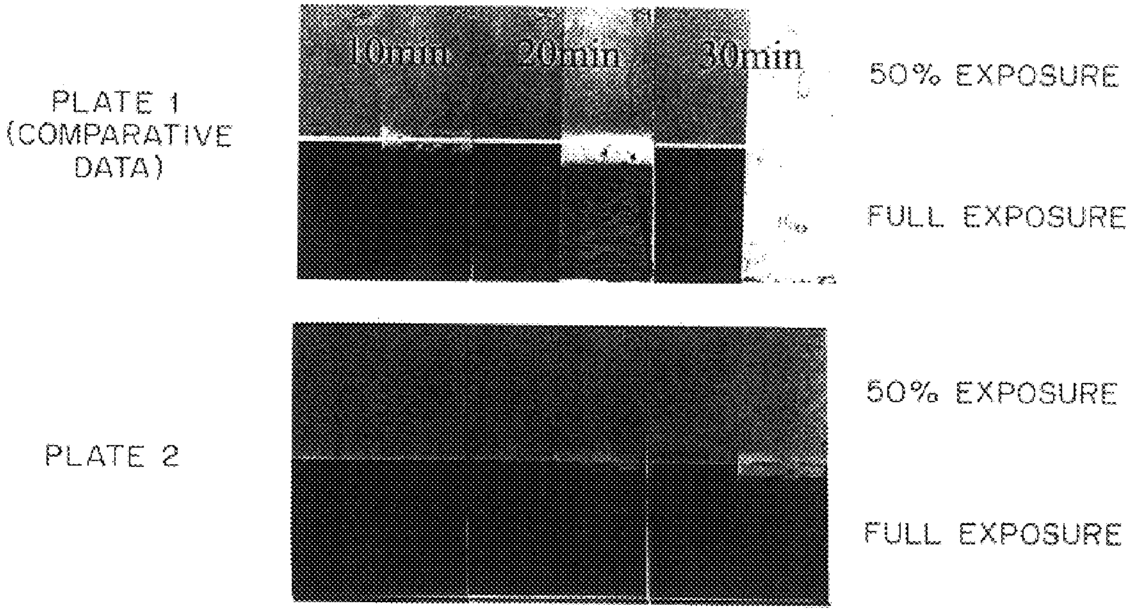
FIG. 2 illustrates the photograph of the checkerboard pattern imaged on the precursors and then processed, using fount solution 2 (see example 4).

The results are shown in Table 2 (imaging test), and in the photographs in FIG. 1 (fount resistance in fount solution 1) and FIG. 2 (fount resistance in fount solution 2). In FIG. 1 there appear four distinct regions which had 10 minutes immersion. The top two of those four regions had received the 50% exposure and the bottom two of those regions had received the full exposure. After 10 minutes immersion a strip of TESA 4122 adhesive tape was placed from top to bottom along the right-hand side of the sample, so that some 50% and some solid area was covered, and was then rapidly ripped away in one sharp movement to remove loose coating. It will be seen that the solid region was degraded significantly and that the 50% region was also subject to some coating loss. The same test carried out on Plate 1 samples immersed for 20 minutes and 30 minutes respectively caused substantially complete coating removal. This is shown by the two light squares along the right-hand side of the 20 minutes region and by the two light squares along the right-hand side of the 30 minutes region.

In contrast, Plate 2 of FIG. 1, bearing a coating in accordance with the invention, was subject to only very slight degradation after 10 minutes of immersion, to much less degradation at 20 minutes of immersion than the comparative Plate 1, and to substantial degradation only after 30 minutes of immersion.

Considering now FIG. 2, for the comparative Plate 1 the coating was substantially entirely removed after 30 minutes of immersion, and significantly degraded after 20 minutes. In contrast, on Plate 2 there was virtually no coating loss even after 30 minutes of immersion.

TABLE 2

| | Laser Imaged Area | |
|---|---|---|
| Theoretical % Dot Size | Actual % Dot Size Plate 1 | Actual % Dot Size Plate 2 |
| 2 | 2 | 2 |
| 5 | 5 | 5 |
| 10 | 10 | 10 |
| 20 | 20 | 19 |
| 30 | 30 | 29 |
| 40 | 39 | 39 |
| 50 | 50 | 50 |
| 60 | 61 | 60 |
| 70 | 71 | 71 |
| 80 | 82 | 81 |
| 90 | 92 | 91 |
| 95 | 97 | 96 |

Similar experiments to those described above were carried out using, instead of acidic cellose compounds, compounds of the following type: a polymeric acid of methacrylic/acrylic acid type; a copolymer of maleic acid; an acidic polyester (PHTALOPAL, from BASF, acid number 190–205); an acidic collophonium derivative (ROKRALAT VP 1449, from R. Kraemer, acid number 70–90); and acidic polyvinyl acetal (as described in U.S. Pat. No. 5,700,619). However, such compounds did not show the solvent restistance benefits shown by the acidic cellulose compounds.

The following product names given above are believed to be trade marks: PD-140A, PMP 92, CAP, ADS 830A, DOWANOL PM, Developer 2000M, Developer 3000, EC 2117, ADS 1060A, OB 613, TRILON B, PLURIOL P600, ZH 8050, LB 6564, LB 744, KF 654, SILIKOPHEN P50X, CAHP, COMBIFIX, SUBSTIFIX, PHTHALOPAL, ROKRALAT VP, SELLOTAPE, POLYTAM and TESA 4122.

While the invention has been described in terms of the foregoing specific embodiments, it will be apparent to those skilled in the art that various alterations and modifications may be made to the described embodiments without departing from the scope of the invention, which is limited only by the appended claims. The disclosed embodiments are provided merely by way of example.

What is claimed is:

1. A film-forming composition comprising a carboxylic acid derivative of a cellulosic polymer, and a compound which absorbs incident radiation in the wavelength range 600–1400 nm and converts it to heat, wherein the carboxylic acid derivative of the cellulosic polymer is present in an amount of 2–50% of the weight of the composition, the composition having the property that when provided as a coating on a substrate, imagewise heated and subjected to an aqueous developer, regions which have been heated dissolve in the aqueous developer leaving behind regions which have not been heated and which are resistant to organic liquids, wherein the composition comprises 0.1–10% of a siloxane polymer, by weight of the coating.

2. A composition as claimed in claim 1, wherein the carboxylic acid derivative of the cellulosic polymer provides 2–30% of the weight of the composition.

3. A composition as claimed in claim 2, wherein the carboxylic acid derivative of the cellulosic polymer provides 5–20% of the weight of the composition.

4. A composition as claimed in claim 3, wherein the carboxylic acid derivative of the cellulosic polymer provides 8–12% of the weight of the composition.

5. A composition as claimed in claim 1, wherein the carboxylic acid derivative of the cellulosic polymer has an acid number in the range 50–210.

6. A composition as claimed in claim 5, wherein the acid number is in the range 100–180.

7. A composition as claimed in claim 1, wherein said carboxylic acid derivative of a cellulosic polymer is a carboxylic acid derivative of a cellulose acetate.

8. A composition as claimed in claim 7, wherein said carboxylic acid derivative of a cellulosic polymer is a phthalate derivative of a cellulose acetate.

9. A composition as claimed in claim 1 wherein the carboxylic acid derivative of a cellulosic polymer is selected from the group consisting of cellulose acetate phthalate, cellulose acetate hydrogen phthalate, and cellulose acetate trimellitate.

10. A composition as claimed in claim 1 wherein the composition comprises a resin blend having as one component said carboxylic acid derivative of a cellulosic polymer and as a further resin component a material selected from a group consisting of a polymer or copolymer of styrene, a polymer or copolymer of hydroxystyrene, a polymer or copolymer of an alkoxystyrene, a polymer or copolymer of acrylic acid, a polymer or copolymer of methacrylic acid, a polymer or copolymer of acrylonitrile, a polymer or copolymer of acrylamide, a polymer or copolymer of vinyl alcohol, an acrylate polymer or copolymer, a polymer or copolymer of methacrylamide, a sulphonamido or imido polymer or copolymer, a polymer or copolymer of maleiimide or of alkylmaleiimide or of dialkylmaleiimide, a polymer or copolymer of maleic anhydride and a hydroxycellulose or a carboxycellulose.

11. A composition as claimed in claim 1, wherein the composition comprises a resin blend having as one component said carboxylic acid derivative of a cellulosic polymer and as a further resin component a polymer having hydroxyl groups.

12. A composition as claimed in claim 11, wherein said further resin component is selected from a group consisting of a phenolic resin and a poly(hydroxystyrene) resin.

13. A composition as claimed in claim 1, wherein the composition comprises one or more insolubilizer(s) to confer on the composition the property that when provided as a coating on a substrate unheated regions of the coating have reduced solubility in the aqueous developer, compared with a corresponding composition without the insolubilizer(s).

14. A composition as claimed in claim 1, wherein the composition has the property that when provided as coating on a substrate the solubility of the coating in the aqueous developer is not substantially increased by ambient ultraviolet radiation.

15. A composition as claimed in claim 1, wherein the composition contains a cyanine dye.

16. A composition as claimed in claim 1, wherein the composition contains a cationic triarylmethane dye.

17. A positive working printing plate precursor or electronic part precursor or mask precursor having a coating on a substrate, the coating comprising a composition as claimed in claim 1.

18. A method of manufacturing a printing plate precursor or electronic part precursor or mask precursor as claimed in claim 17, the method comprising the steps of (i) providing the coating on the substrate; and (ii) subjecting the coated substrate to a stabilizing heat treatment.

19. A method for preparing a printing plate or electronic part or mask from a positive working printing plate precursor or electronic part precursor or mask precursor as claimed in claim 17, the method comprising the steps of i) heating the coating imagewise; and ii) removing the heated regions of the coating using a developer liquid.

20. A printing plate, electronic part or mask prepared by a method as claimed in claim 19.

21. A method of manufacturing a positive working printing plate precursor or electronic part precursor or mask precursor having a coating on a substrate, the coating comprising a film-forming composition comprising a carboxylic acid derivative of a cellulosic polymer, and a compound which absorbs incident radiation in the wavelength range 600–1400 nm and converts it to heat, the composition having the property that when provided as a coating on a substrate, imagewise heated and subjected to an aqueous developer, regions which have been heated dissolve in the aqueous developer leaving behind regions which have not been heated and which are resistant to organic liquids; wherein the method comprises the steps of (i) providing the coating on the substrate, and (ii) subjecting the coated substrate to a stabilizing heat treatment, wherein the heat treatment is carried out for at least 4 hours at a temperature in the range 40–90° C.

* * * * *

UNITED STATES PATENT AND TRADEMARK OFFICE

CERTIFICATE OF CORRECTION

PATENT NO. : 6,391,524 B2 
DATED : May 21, 2002
INVENTOR(S) : Yates et al.

It is certified that error appears in the above-identified patent and that said Letters Patent is hereby corrected as shown below:

Title page,
Item [56], References Cited, OTHER PUBLICATIONS, under D19C, "Densitomer" should read -- Densitometer --; and "GretagzMacbeth" should read -- GretagMacbeth --

Column 1,
Line 5, "imagable" should read -- imageable --
Line 67, "collophony" should read -- colophony --

Column 3,
Line 23, "(ie" should read -- i.e., --
Line 23, "4hydroxy4-methyl-2-pentanone" should read -- 4-hydroxy-4-methyl-2-pentanone --
Line 27, "(ie" should read -- i.e., --

Column 4,
Third formula, "$—CR^1R^2)_n—$" should read -- $—(CR^1R^2)_n—$ --

Column 5,
After third formula insert: --  --

Column 6,
Line 23, "maleiimido" should read -- maleimido --
Line 24, "alkymaleiimide" should read -- alkylmaleimide --; and "dialkylmaleiimide" should read -- dialkylmaleimide --

Column 7,
Line 11, "quarternized" should read -- quaternized --

Column 8,
Line 1, "100—$Si(R^1)(R^2)$" should read -- 100 —$Si(R^1)(R^2)$ --
Line 2, "O—repeat" should read -- O— repeat --
Line 59, "s" should be deleted Column 10,
Line 2, "dissolved," should read -- dissolved --
Line 34, "herein ," should read -- herein, --
Line 60, "6OOnm" should read -- 600 nm --

UNITED STATES PATENT AND TRADEMARK OFFICE

CERTIFICATE OF CORRECTION

PATENT NO. : 6,391,524 B2
DATED : May 21, 2002
INVENTOR(S) : Yates et al.

It is certified that error appears in the above-identified patent and that said Letters Patent is hereby corrected as shown below:

Column 11,
Lines 8 and 27, “imagable” should read -- imageable --
Line 55, “maleintide” should read -- maleimide --

Column 12,
Line 62, “2wt%” should read -- 2 wt% --

Column 13,
Structure at line 35:

“ 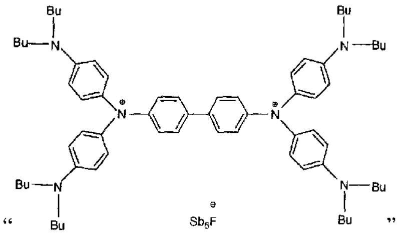 ”

should read

-- 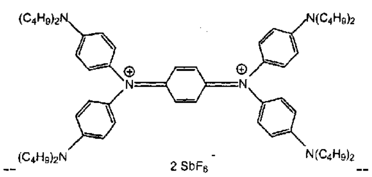 --

Line 55, “tetraaeetic” should read -- tetraacetic --

Column 15,
Third structure, above first $\underset{H}{C}=\underset{H}{C}$ bond: insert -- $Br^{\ominus}$ --

Column 16,
Line 18, “matt” should read -- matte --

Column 17,
Line 36, “cellose” should read -- cellulose --
Line 39, “(PHTALOPAL,” should read -- (PHTHALOPAL, --
Line 40, “collophonium” should read -- colophonium --
Line 44, “tistance” should read -- istance --

Column 18,
Line 42, “sulphonamido”should read -- sulfonamido --

UNITED STATES PATENT AND TRADEMARK OFFICE

CERTIFICATE OF CORRECTION

PATENT NO. : 6,391,524 B2 
DATED : May 21, 2002
INVENTOR(S) : Yates et al.

It is certified that error appears in the above-identified patent and that said Letters Patent is hereby corrected as shown below:

<u>Column 18,</u>
Line 42, "sulphonamido"should read -- sulfonamido --
Line 43, "maleiimide" should read -- maleimide --
Line 44, "alkymaleiimide" should read -- alkylmaleimide --; and "dialkylmaleiimide" should read -- dialkylmaleimide --

Signed and Sealed this

Fourteenth Day of January, 2003

JAMES E. ROGAN
*Director of the United States Patent and Trademark Office*